(12) United States Patent
Goodno

(10) Patent No.: US 11,294,193 B2
(45) Date of Patent: Apr. 5, 2022

(54) WAVELENGTH-CONTROLLED BEAM STABILIZER FOR SPECTRALLY BEAM COMBINED LASER SOURCES

(71) Applicant: NORTHROP GRUMMAN SYSTEMS CORPORATION, Falls Church, VA (US)

(72) Inventor: Gregory D. Goodno, Los Angeles, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 785 days.

(21) Appl. No.: 16/216,349

(22) Filed: Dec. 11, 2018

(65) Prior Publication Data

US 2020/0183175 A1    Jun. 11, 2020

(51) Int. Cl.
*G02B 27/10* (2006.01)
*G02F 1/39* (2006.01)
(Continued)

(52) U.S. Cl.
CPC ........... *G02B 27/1006* (2013.01); *G02B 6/28* (2013.01); *G02B 6/4215* (2013.01); *G02F 1/395* (2013.01);
(Continued)

(58) Field of Classification Search
CPC ............. G02B 27/1006; H01S 3/06783; H01S 3/06754; H01S 3/1301
See application file for complete search history.

(56) References Cited

U.S. PATENT DOCUMENTS

| 4,847,479 A | 7/1989 | Clark et al. |
|---|---|---|
| 7,199,924 B1 | 4/2007 | Brown et al. |
| (Continued) | | |

FOREIGN PATENT DOCUMENTS

CN    104901149 A    9/2015

OTHER PUBLICATIONS

Thomas H. Loftus, Anpig Liu, Paul R. Hoffman, Alison M. Thomas, Marc Norsen, Rob Royse, and Eric Honea; 522 W Average Power, Spectrally Beam-Combined Fiber Laser with Near-Diffraction-Limited Beam Quality; Optics Letters; Feb. 15, 2007, pp. 349-351; vol. 32, No. 4; Optical Society of America, US.
(Continued)

*Primary Examiner* — Eric L Bolda
(74) *Attorney, Agent, or Firm* — John A. Miller; Shumaker, Loop & Kendrick, LLP

(57) ABSTRACT

A fiber amplifier system including a plurality of seed beam sources each generating a seed beam at a different wavelength and a plurality of fiber amplifiers that amplify the seed beams. The system also includes a spectral beam combining (SBC) grating that spatially combines the amplified beams and directs them in the same direction as an output beam, and a first fiber sampler and a second fiber sampler that generate a first fiber sample beam having a first intensity and a second fiber sample beam having a second intensity. The system further includes a configuration of optical and electrical feedback components that determine a difference between the first intensity and the second intensity and use the difference to control the wavelength of all of the seed beams so that all of the amplified beams are spatially aligned and propagating in the same direction in the output beam.

20 Claims, 2 Drawing Sheets

(51) Int. Cl.
  *G02B 6/28*   (2006.01)
  *H01S 3/067*  (2006.01)
  *H01S 3/13*   (2006.01)
  *G02B 6/42*   (2006.01)
  *H01S 3/10*   (2006.01)

(52) U.S. Cl.
  CPC ........ *H01S 3/06783* (2013.01); *H01S 3/1003* (2013.01); *H01S 3/1301* (2013.01)

(56) References Cited

U.S. PATENT DOCUMENTS

| | | |
|---|---|---|
| 7,233,442 B1 | 6/2007 | Brown et al. |
| 8,630,323 B2 | 1/2014 | Honea et al. |
| 2011/0032602 A1* | 2/2011 | Rothenberg .......... H01S 3/2383 359/341.1 |
| 2016/0109290 A1* | 4/2016 | Klennert ............ G02B 27/1006 356/416 |
| 2017/0304942 A1 | 10/2017 | Ogata |
| 2019/0305504 A1* | 10/2019 | Goodno .............. H01S 3/10015 |

OTHER PUBLICATIONS

Haas, Matthias; Rauch, Simon; Nagel, Simon; Irmler, Lukas; Dekorsy, Thomas; and Zimer, Hagen; "Thin-film filter wavelength-stabilized, grating combined, high-brightness kW-class direct diode laser"; Optics Express 17657-17670; vol. 25, No. 15, Jul. 24, 2017.

\* cited by examiner

WAVELENGTH-CONTROLLED BEAM STABILIZER FOR SPECTRALLY BEAM COMBINED LASER SOURCES

BACKGROUND

Field

This disclosure relates generally to a fiber laser amplifier system that employs a plurality of beam channels that generate amplified beams at different wavelengths that are combined by spectral beam combining (SBC) and, more particularly, to a fiber laser amplifier system that employs a plurality of beam channels that generate amplified beams at different wavelengths that are combined by SBC, where the system provides feedback to control and stabilize the wavelength of the beams in each channel so that all of the beams point in the same direction.

Discussion

High power laser amplifiers have many applications, including industrial, commercial, military, etc. One specific example for high power lasers is laser weapons systems. Designers of laser amplifiers are continuously investigating ways to increase the power of the laser amplifier for these and other applications. One known type of laser amplifier is a fiber laser amplifier that employs a doped fiber that receives a seed beam and a pump beam to amplify the seed beam and generate the laser output beam, where the fiber typically has an active core diameter of about 10-20 µm.

Improvements in fiber laser amplifier designs have increased the output power of the fiber amplifier to approach its practical power and beam quality limit. To further increase the output power some fiber laser systems employ multiple fiber laser amplifiers that combine the amplified beams in some fashion to generate higher powers. A design challenge for fiber laser amplifier systems of this type is to combine the beams from a plurality of fiber amplifiers in a manner so that the beams provide a single beam output having a uniform phase over the beam diameter such that the beam can be focused to a small focal spot. Focusing the combined beam to a small spot at a long distance (far-field) defines the quality of the beam.

One known method for generating high power, near diffraction-limited laser beams is to utilize spectral beam combining (SBC) of multiple narrow-line width fiber amplifiers providing amplified beams at different wavelengths. Particularly, multiple high power laser beam channels each provide an amplified beam at a slightly different wavelength that are imaged onto a dispersive optic, usually a diffraction grating, that combines the beams so that they propagate in the same direction as a single output beam.

In order to provide good beam quality in these types of SBC laser amplifier systems, each laser beam wavelength must be stable and not drift over time so that all of the combined beams point in the same direction after being imaged on the diffraction grating to maximize the power on a far-field target. In other words, it is necessary to ensure that the wavelength of the beam in each channel remains at the desired wavelength so that the pointing direction of each beam off of the grating is in the same direction. However, because of various factors, such a thermal loads on the various components, component position shift, etc., the wavelengths of the beams change over time and the pointing direction of the beams change, thus resulting in a reduced beam quality. Additionally, it is possible that even if the wavelengths of the beams remain stable, the pointing directions of the beams off of the grating may drift because of thermal or mechanical changes in the optics used to combine the beams onto the grating.

It is possible to provide a maintenance schedule where the wavelength of the beams can be periodically measured and corrected. However, this requires added expense and cost. Further, it is possible to provide wavelength lockers in each laser channel that measure the wavelength of the beams and automatically correct any drift in wavelength so that the wavelength is locked to the desired wavelength. However, the more channels that are included in the laser system, the more closely spaced the wavelengths become, and the more precise the wavelength lockers need to be. More specifically, as laser amplifier technology improves, the available spectral brightness of the laser sources increases, which enables narrower linewidths per fiber channel. In order to fit within the available laser gain bandwidth, i.e., typically 30-40 nm for a Yb-doped fiber laser, as more channels are added, the channels must be more closely spaced in wavelength, and hence must be locked in wavelength with higher precision. For example, in order to fit 300 fibers into 30 nm of gain bandwidth, each fiber channel must be spaced by only 0.1 nm (26 GHz) from an adjacent channel. This requires wavelength locking to within about 1 GHz to prevent significant degradation in the combined output beam quality. This level of absolute locking precision is difficult to achieve with conventional Fabry-Perot based wavelength lockers.

SUMMARY

This disclosure discusses and describes a fiber amplifier system including a plurality of seed beam sources, where one source is provided in each of a plurality of fiber amplification channels. Each seed beam source generates a seed beam at a wavelength that is different than the wavelength of the seed beams generated by the other seed beam sources, where each seed beam source includes a beam wavelength tuning capability. The system also includes a fiber amplifier provided in each amplification channel that receives the seed beam in that channel and provides an amplified beam, and an emitter array responsive to all of the separate amplified beams that direct the amplified beams into free space as diverging uncombined beams. The system further includes beam collimating optics responsive to the diverging uncombined beams that focuses the diverging uncombined beams as collimated uncombined beams, and a spectral beam combining (SBC) grating responsive to the collimated uncombined beams that spatially combines the collimated uncombined combined beams so that all of the amplified beams at the different wavelengths are directed in the same direction as an output beam. The system also includes a beam sampler responsive to the output beam that provides a sample beam therefrom that includes a wavelength portion of all of the amplified beams, and a detector assembly responsive to the sample beam. The detector assembly includes a first fiber sampler and a second fiber sampler spaced apart from each other and being positioned relative to the dispersive axis of the SBC grating, where the first fiber sampler generates a first fiber sample beam having a first intensity that includes a wavelength portion of all of the amplified beams, and the second fiber sampler generates a second fiber sample beam having a second intensity that includes a wavelength portion of all of the amplified beams. A configuration of optical and electrical feedback components are responsive to the first and second fiber sample beams, where the feedback components determine a difference between the first intensity of the first sample beam and the second intensity of the second sample beam, and where the feedback components control the wavelength of all of the seed beams so that all of the amplified beams are spatially aligned and propagate in the same direction in the output beam.

Additional features of the disclosure will become apparent from the following description and appended claims, taken in conjunction with the accompanying drawings.

DETAILED DESCRIPTION OF THE EMBODIMENTS

The following discussion of the embodiments of the invention directed to a fiber laser amplifier system that employs a plurality of beam channels operating at different wavelengths that are combined by SBC, where the system includes beam feedback to control the wavelength of the different wavelength beams is merely exemplary in nature, and is in no way intended to limit the disclosure or its applications or uses.

Figure 1:
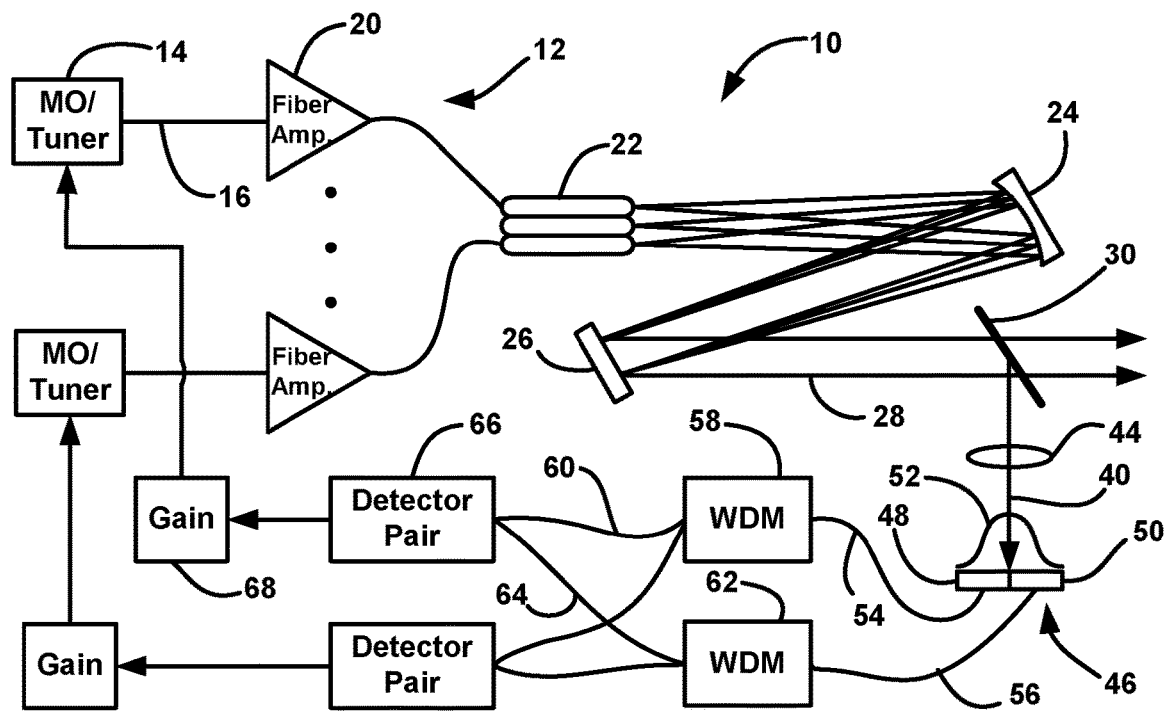
FIG. 1 is a schematic diagram of an SBC fiber laser amplifier system including wavelength stabilization feedback employing two fiber samplers, two WDMs and a balanced detector pair for each SBC channel.

FIG. 1 is a schematic block diagram of an SBC fiber laser amplifier system 10 that includes N number of wavelength channels 12, only two of which are shown, each including a master oscillator (MO) 14 that generates a seed beam provided on a fiber 16 at a particular wavelength λ, where each MO 14 generates a different beam wavelength $\lambda_1-\lambda_N$. Each MO 14 includes components to tune the beam wavelength λ, such as a thermoelectric cooler (TEC) actuator that provides thermal control of the wavelength λ, or a current actuator that provides current control of the wavelength λ. Each of the seed beams on the fiber 16 is sent to a fiber amplifier 20, where the amplifier 20 will typically be a doped amplifying portion of the fiber 16 that receives an optical pump beam (not shown). Each channel 12 may include a number of other optical components, for example, an electro-optic modulator for modulating the seed beam, a phase modulator for controlling the phase of the seed beam, a polarization modulator for controlling the polarization of the seed beam, etc. All of the amplified beams are directed to an optical emitter array 22 that outputs a set of diverging amplified beam into free space, where the individual beam wavelengths λ are propagating from slightly different emitter positions. The diverging beams are reflected off of collimating optics 24 that collimates the diverging beams and directs them onto a spectral beam combining (SBC) grating 26 so that all of the individual beams impact the grating 26 and overlap on the same footprint. The grating 26 spatially diffracts the individual beam wavelengths λ and directs the individual beams in the same direction as a combined output beam 28.

The spectrally combined output beam 28 is directed onto a beam sampler 30 that splits off a small portion of the beam 28 as a sample beam 40. The sample beam 40 is received by an imaging lens 44 that focuses the sample beam 40 to generate a far-filed image onto a detector assembly 46 including a first side fiber sampler 48 and a second side fiber sampler 50, where the samplers 48 and 50 operate as spatial filters. The fiber samplers 48 and 50 are positioned along the dispersive axis of the grating 26 approximately one far-field beam diameter apart from each other so that each fiber sampler 48 and 50 is near the maximum slope of a Gaussian beam intensity distribution 52 of the sample beam 40. The detected beam portion from the sampler 48 is provided on a fiber 54 and the detected beam portion from the sampler 50 is provided on a fiber 56. The detected beam portion on the fiber 54 is provided to a wavelength-demultiplexer (WDM) 58 that separates the detected beam portion into its constituent wavelengths each being provided on a separate one of N number of fibers 60. Likewise, the detected beam portion on the fiber 56 is provided to a WDM 62 that separates the detected beam portion into its constituent wavelengths each being provided on a separate one of N number of fibers 64. The WDMs 58 and 62 can be any wavelength selective component suitable for the purposes discussed herein, such as a series of fiber Bragg gratings or an arrayed waveguide grating (AWG).

Each particular fiber 60 and 64 carrying the same wavelength λ from the WDMs 58 and 62, i.e., the optical power of the wavelength from both fiber samplers 48 and 50, is sent to and detected by one of an N number of balanced detector pairs 66, where each detector pair 66 measures the photocurrent of the beam portions on the fibers 60 and 64 and provides a differential output of the difference between the powers of the two detected beam portions at the particular wavelength λ. If the particular wavelength λ in the sample beam 40 is propagating in the proper direction, i.e., spatially aligned, then the detected beam portions from the samplers 48 and 50 will have the same intensity, and the output of the detector pair 66 for that particular wavelength λ will be nulled or zero. Thus, if all of the beams are at their proper wavelength, then the measured intensity of the sample beam 40 by the fiber samplers 48 and 50 will be the same. If any one of the particular wavelengths $\lambda_1-\lambda_N$ in the sample beam 40 is not properly spatially aligned, then the detected beam portion from the samplers 48 and 50 will not have the same intensity, and the output of the detector pair 66 for that particular wavelength 2L will be an error signal, which can be used to control the wavelength of the seed beam for that channel 12 so that amplified beam is put back into alignment.

The differential outputs from each detector pair 66 is sent to a gain controller 68 that sends an error signal to the MO 14 for that channel 12 to change the wavelength λ of the seed beam until the output of the detector pair 66 is zero. For example, the output of the gain controller 68 can cause an increase or decrease of the temperature of the laser emitter in the MO 14, which changes its wavelength λ. Thus, by properly controlling the wavelength λ of the seed beams from the MOs 14, the amplified beams are properly steered from the grating 26 so that the same beam power impinges the fiber samplers 48 and 50, and will all be co-aligned in the far-field for proper output beam power.

The discussion above talks about correcting the wavelength λ of the seed beams if they change to provide proper beam alignment. However, the operation of the system 10 as discussed also provides beam alignment if the components in the system 10 become misaligned even though the wavelength of the beam may be at the desired wavelength. Particularly, the system 10 provides beam misalignment-insensitivity in that since all of the channel beams are sampled by the same elements, they will naturally be co-aligned. Any drift in the common free space optics, or in the beam sampling elements, will result in identical shifts in the beam wavelengths, thus ensuring that the beams remain co-aligned in the combined output beam 28 with only a global pointing shift that would naturally be accommodated in a laser weapons system by the beam control system.

In principle, grating dispersion coupled with the finite linewidth of each channel 12 could lead to misalignment between the channel beams. This is because, in addition to combining the different wavelengths, the diffraction grating 26 will also angularly disperse each beam's spectrum. This means that the spectra entering the spatially displaced fiber samplers 48 and 50 will not be identical. One fiber sampler 48 or 50 will sample the blue edges of all of the channel beams and the other fiber sampler 48 or 50 will sample all of the red edges of the channel beams. The gain controllers 68 will align the beams so that the blue power entering one fiber sampler 48 or 50 is equal to the red power entering the other fiber sampler 48 or 50. This will not lead to spatial misalignment errors as long as the spectrum of each seed beam has even symmetry, even if the linewidths of the different amplification channels 12 are not the same. Typically, the linewidths of each channel 12 are generated by phase modulation using either noise-broadening or by digital code modulation, such as by using a pseudo-random bit sequence, both of which ideally yield symmetric spectra. However, if the spectrum of a channel 12 is asymmetric, then that channel 12 will be misaligned in comparison to a symmetric channel. In practice, asymmetric spectra are sometimes observed when the broadening RF electronics are highly saturated, which is usually when they are operated beyond their design point, i.e., to temporarily increase the linewidths for test purposes. This effect in practice leads to relative misalignments of only a small fraction of a diffraction-limited spot diameter in the far-field, and thus has negligible impact on performance of the system.

Other embodiments can use the same concept for spatial/spectral sensing, but which incorporate temporal multiplexing to reduce component count and reduce size and weight (SaW) at the expense of control bandwidth. The control bandwidth is not expected to be a limitation for most systems since typically wavelength drifts in the gratings or structural relaxation in the free space optics occurs due to component aging. The highest speed disturbance in a real system is likely to be thermal growth or thermo-optic distortion that develops during a high power shot, typically over many seconds of operation, and thus can be corrected with Hz-class loop speeds.

Figure 2:
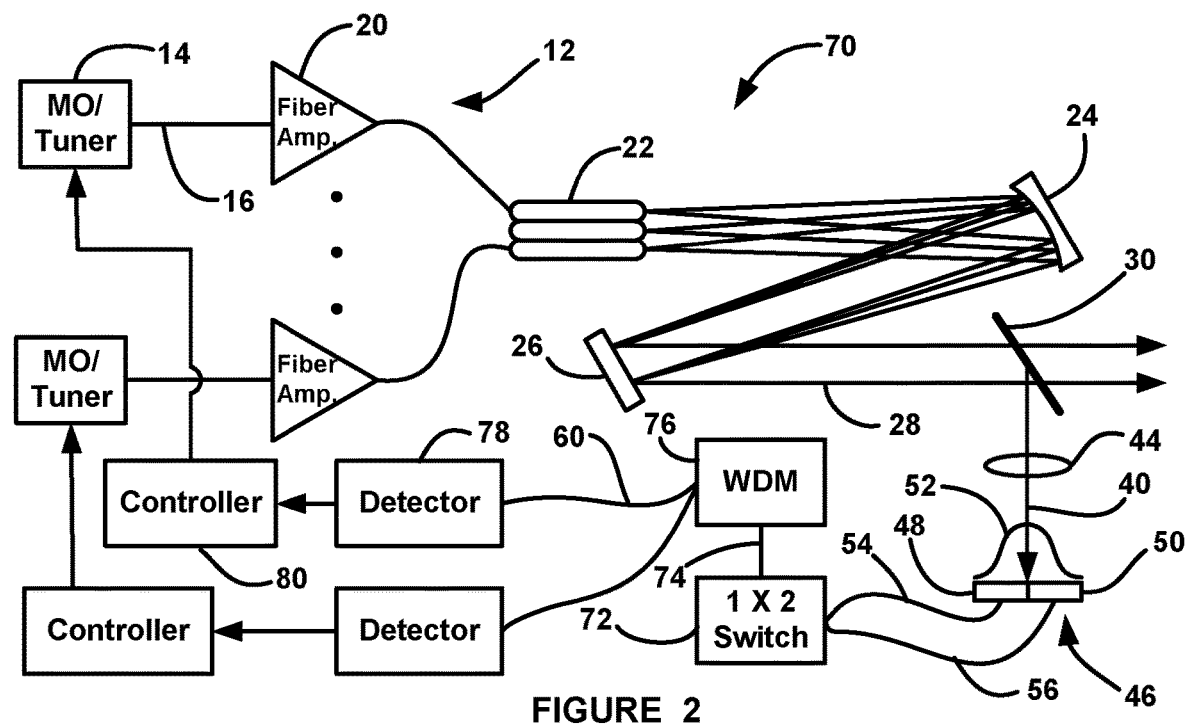
FIG. 2 is a schematic diagram of an SBC fiber laser amplifier system including wavelength stabilization feedback employing two fiber samplers, a 1×2 switch, a WDM and a single detector for each SBC channel.

FIG. 2 is a schematic block diagram of an SBC fiber laser amplifier system 70 that is similar to the amplifier system 10, where like elements are identified by the same reference numbers. In the system 70, a 1×2 switch 72 has been included in the feedback that is coupled to the fibers 54 and 56, where the switch 72 selectively alternates between outputting the detected beam portions from the fibers 54 and 56 on a fiber 74. The WDMs 58 and 62 have been replaced with a single WDM 76 that receives the detected beam portions on the fiber 74 from the switch 72. Thus, the WDM 76 outputs all of the different wavelength beams on the fibers 60 at the same time, but only from one of the fiber samplers 48 and 50. Therefore the detector pairs 66 can be replaced with single detectors 78 for each channel 12. The output of each detector 78 is sent to a controller 80 for each channel 12, and each controller 80 measures the signals from the detector 78 at consecutive time frames to compare the intensities of the detected beam portions from the fiber samplers 48 and 50 and control the MOs 14 in the manner as discussed above. The system 70 may be simpler to implement than the system 10 because it uses common elements for each wavelength channel 12, thus eliminating the propensity for wavelength drift in the electrical gain balance between the detector pairs 66, and facilitating calibrations.

Figure 3:
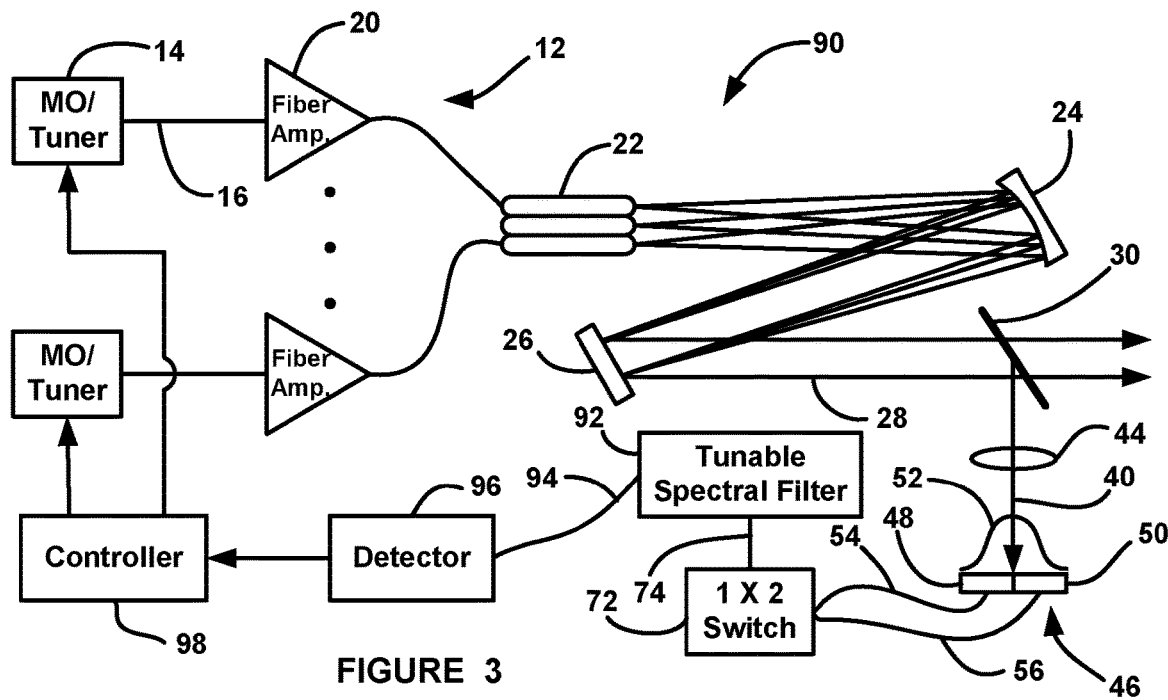
FIG. 3 is a schematic diagram of an SBC fiber laser amplifier system including wavelength stabilization feedback employing two fiber samplers, a 1×2 witch, a dynamic tunable spectral filter, a single detector and a single controller with multiple outputs.

FIG. 3 is a schematic block diagram of an SBC fiber laser amplifier system 90 that is similar to the amplifier system 70, where like elements are identified by the same reference numbers. In the system 90, the single WDM 76 is replaced with a dynamic tunable spectral filter 92 that is capable of separating all of the N wavelengths 2L in the detected beam portions from the fiber samplers 48 and 50 and sequentially outputting one of those wavelength beams from the fiber samplers 48 and 50 at particular points in time onto an output fiber 94. For each setting of the filter 92, sequential power measurements of each side of the beam would be acquired by actuating the switch 72. The spectral filter 92 can be any device suitable for the purposes discussed herein, such as Waveshaper™ modules. Therefore, all of the single detectors 78 for each wavelength beam can be replaced with a single detector 96 for all of the wavelength beams and all of the controllers 80 for each wavelength beam can be replaced with a single controller 98 for all of the wavelength beams. The controller 98 in the system 90 looks at the signals from the detector 96 at consecutive time frames to compare the intensities of the detected beam portions having the same wavelength from the fiber samplers 48 and 50 and control the MOs 14 in the manner as discussed above. The system 90 enables wavelength control using less hardware, i.e., a lower SaW, and would be relevant for fiber amplifier systems where high control bandwidth is not needed, i.e., systems where wavelength or spatial misalignment drifts are slow in comparison to the time required for the filter 92 to scan through the entire wavelength array.

Figure 4:
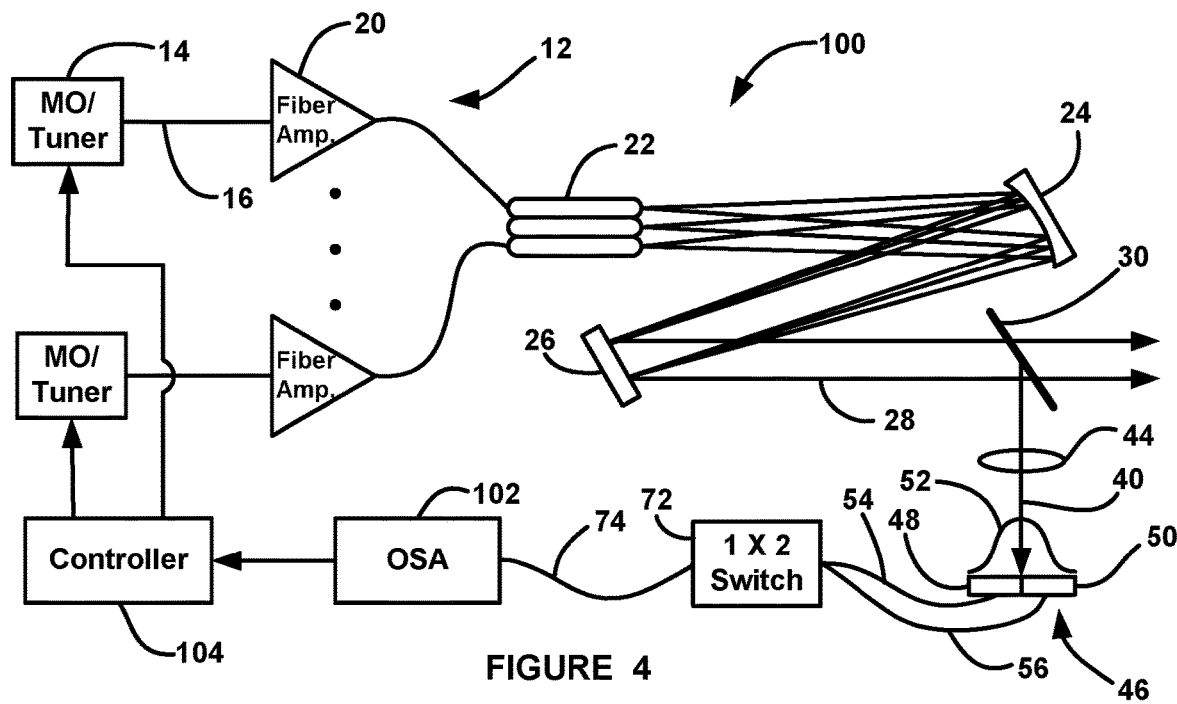
FIG. 4 is a schematic diagram of an SBC fiber laser amplifier system including wavelength stabilization feedback employing two fiber samplers, a 1×2 switch and an optical spectrum analyzer (OSA).

FIG. 4 is a schematic block diagram of an SBC fiber laser amplifier system 100 that is similar to the amplifier system 90, where like elements are identified by the same reference numbers. In the system 100, the filter 92, the output fiber 94 and the detector 96 are replaced with a spectrometer or optical spectrum analyzer (OSA) 102 that generates two sequentially measured spectra from the two switch positions. In other words, the OSA 102 is able to separate and measure the power of the individual wavelengths in the detected beam portions from the fiber samplers 48 and 50, where the output of the OSA 102 provides a spectral scan of power versus wavelength. The OSA 102 can be any device suitable for the purposes discussed herein. A controller 104 looks at the signals from the OSA 102 at consecutive time frames to compare the intensities or powers of the detected beam portions having the same wavelength λ from the fiber samplers 48 and 50 and control the MOs 14 in the manner as discussed above.

The fiber amplifiers systems discussed herein may have utility for industrial laser systems based on SBC of direct diodes. Currently, such systems typically use an external optical feedback cavity to ensure wavelength-locking of the individual emitters, which leads to issues with longevity and damage. An approach of the type described herein using external electrical feedback, with no direct optical feedback to the emitter could alleviate these issues. Similar to DFB packaged diodes used as the seed beams for fiber-based SBC, wavelength tuning of high power direct diodes could be actuated by emitter temperature or by drive current.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A fiber amplifier system comprising:
   a plurality of seed beam sources where one source is provided in each of a plurality of fiber wavelength amplification channels, each seed beam source generating a seed beam at a wavelength that is different than the wavelength of the seed beams generated by the other seed beam sources, wherein each seed beam source includes a beam wavelength tuning capability;
   a fiber amplifier provided in each amplification channel that receives the seed beam in that channel and provides an amplified beam;
   an emitter array responsive to all of the separate amplified beams and directing the amplified beams into free space as diverging uncombined beams;
   beam collimating optics responsive to the diverging uncombined beams and redirecting the diverging uncombined beams as collimated uncombined beams;
   a spectral beam combining (SBC) grating responsive to the collimated uncombined beams and spatially combining the collimated uncombined beams at the different wavelengths so that all of the separate amplified beams in the collimated uncombined beams are directed in the same direction as an output beam;
   a beam sampler responsive to the output beam and providing a sample beam therefrom that includes a wavelength portion of all of the amplified beams;
   a far-field optic responsive to the sample beam and generating a far-field image of the sample beam;
   a detector assembly responsive to the far-field image of the sample beam, said detector assembly including a first fiber sampler and a second fiber sampler spaced apart from each other and being positioned relative to a dispersive axis of the SBC grating, said first fiber sampler generating a first fiber sample beam having a first intensity and including a wavelength portion of all of the amplified beams, and said second fiber sampler generating a second fiber sample beam having a second intensity and including a wavelength portion of all of the amplified beams; and
   a configuration of optical and electrical feedback components responsive to the first and second fiber sample beams, said feedback components determining a difference between the first intensity of the first fiber sample beam and the second intensity of the second fiber sample beam, said feedback components using the difference between the intensities to control the wavelengths of all of the seed beams so that all of the amplified beams are spatially aligned and propagating in the same direction in the output beam.

2. The system according to claim 1 wherein the first and second fiber samplers are positioned so that they both are at a maximum slope of a Gaussian intensity distribution of the far-field image of the sample beam.

3. The system according to claim 2 wherein each of the first and second fiber samplers are spaced apart about one far-field beam diameter.

4. The system according to claim 1 wherein the feedback components control a current actuator in the beam sources to provide current control for changing the wavelengths of the seed breams.

5. The system according to claim 1 wherein the feedback components control a temperature actuator in the beam sources to provide temperature control for changing the wavelengths of the seed beams.

6. The system according to claim 1 wherein the feedback components correct the wavelengths of the amplified beams in response to changes in the wavelengths of the amplified beams.

7. The system according to claim 1 wherein the feedback components correct the wavelengths of the amplified beams in response to changes in positions of components in the system.

8. The system according to claim 1 wherein the feedback components include a first wavelength-demultiplexer (WDM) responsive to the first fiber sample beam that separately outputs each of the wavelength portions of all of the amplified beams in the first fiber sample beam on a different fiber for each wavelength channel, a second WDM responsive to the second fiber sample beam that separately outputs each of the wavelength portions of all of the amplified beams in the second fiber sample beam on a different fiber for each wavelength channel, a plurality of detector pairs including one detector pair for each wavelength channel, where each detector pair is responsive to the wavelength portion of the amplified beams having the same wavelength from both the first and second WDMs and where each detector pair outputs a differential signal identifying a difference in the intensity of the wavelength portion of the amplified beams having the same wavelength, and a plurality of control devices including one control device for each channel, each control device being responsive to the differential signal for a particular channel and controlling a wavelength of the seed beam source for that channel using the differential signal.

9. The system according to claim 1 wherein the feedback components include a 1×2 switch responsive to the first fiber sample beam and the second fiber sample beam and selectively outputting either the first fiber sample beam or the second fiber sample beam, a wavelength-demultiplexer (WDM) responsive to the first fiber sample beam and the second fiber sample beam from the switch and outputting each of the wavelength portions of the amplified beams having the same wavelength in the first and second fiber sample beams on a different fiber for each wavelength channel, a plurality of detectors including one detector for each wavelength channel, where each detector is responsive to the wavelength portion of the amplified beams having the same wavelength from the WDM and where each detector outputs an electrical signal identifying an intensity of the wavelength portion of the amplified beams having the same wavelength, and a plurality of control devices including one control device for each wavelength channel, each control device being responsive to the electrical signal from a detector for a particular wavelength channel, determining a difference in the intensities of the wavelength portion of the amplified beams having the same wavelength from the first and second fiber sample beams for that channel and controlling the wavelength of the seed beam source for that channel using the electrical signal.

10. The system according to claim 1 wherein the feedback components include a 1×2 switch responsive to the first fiber sample beam and the second fiber sample beam and selectively outputting either the first fiber sample beam or the second fiber beam, a tunable spectral filter responsive to the first fiber sample beam and the second fiber sample beam from the switch and selectively separating and outputting the wavelength portion of the amplified beams having the same wavelength in the first and second fiber sample beams, a single detector selectively responsive to the output from the spectral filter and outputting an electrical signal identifying an intensity of each wavelength portion of the amplified beams having the same wavelength, and a single control device responsive to the electrical signals from the detector, determining a difference in the intensities of the wavelength portions of the amplified beams having the same wavelength from the first and second fiber sample beams for each channel and controlling the wavelength of the seed beam source for that channel using the electrical signal.

11. The system according to claim 1 wherein the feedback components include a 1×2 switch responsive to the first fiber sample beam and the second fiber sample beam and selectively outputting either the first fiber sample beam and the second fiber sample beam, an optical spectrum analyzer (OSA) responsive to the first fiber sample beam and the second fiber sample beam from the switch, said OSA separating and detecting the power of the different wavelengths in both the first and second fiber sample beams and outputting an intensity signal identifying the detected power of the beams, and a single control device responsive to the electrical signals from the OSA, determining a difference in the intensity of the wavelength portions of the amplified beams having the same wavelength from the first and second fiber sample beams for each channel, and controlling the wavelength of the seed beam source for that channel using the electrical signal.

12. A fiber amplifier system comprising:
a plurality of seed beam sources where one source is provided in each of a plurality of fiber amplification channels, each seed beam source generating a seed beam at a wavelength that is different than the wavelength of the seed beams generated by the other seed beam sources, wherein each seed beam source includes a beam wavelength tuning capability;
a fiber amplifier provided in each amplification channel that receives the seed beam in that channel and provides an amplified beam;
an emitter array responsive to all of the separate amplified beams and directing the amplified beams into free space as diverging uncombined beams;
beam collimating optics responsive to the diverging uncombined beams and redirecting the diverging uncombined beams as collimated uncombined beams;
a spectral beam combining (SBC) grating responsive to the collimated uncombined beams and spatially combining the collimated uncombined beams at the different wavelengths so that all of the separate amplified beams in the collimated uncombined beams are directed in the same direction as an output beam;
a beam sampler responsive to the output beam and providing a sample beam therefrom that includes a portion of all of the amplified beams;
a far-field optic responsive to the sample beam and generating a far-field image of the sample beam;
a detector assembly positioned in the far-field of the system and being responsive to the sample beam, said detector assembly including a first fiber sampler and a second fiber sampler spaced apart from each other and being positioned relative to a dispersive axis of the SBC grating, said first fiber sampler generating a first fiber sample beam having a first intensity and including a wavelength portion of all of the amplified beams, and said second fiber sampler generating a second fiber sample beam having a second intensity and including a wavelength portion of all of the amplified beams, wherein the first and second fiber samplers are positioned about one far-field beam diameter apart so that they are at a maximum slope of a Gaussian intensity distribution of the far-field image of the sample beam;
a 1×2 switch responsive to the first fiber sample beam and the second fiber sample beam and selectively outputting either the first fiber sample beam or the second fiber sample beam;
a tunable spectral filter responsive to the first fiber sample beam and the second fiber sample beam from the switch and selectively separating and outputting the wavelength portion of the amplified beams having the same wavelength in the first and second fiber sample beams;
a single detector selectively responsive to the output from the spectral filter and outputting an electrical signal identifying an intensity of each wavelength portion of the amplified beams having the same wavelength; and
a single control device responsive to the electrical signals from the detector, determining a difference in the intensity of the wavelength portion of the amplified beams having the same wavelength from the first and second fiber sample beams for each channel and controlling the wavelength of the seed beam source for that channel using the electrical signal.

13. The system according to claim 12 wherein the feedback components control a current actuator in the beam sources to provide current control for changing the wavelengths of the seed breams.

14. The system according to claim 12 wherein the feedback components control a temperature actuator in the beam sources to provide temperature control for changing the wavelengths of the seed beams.

15. The system according to claim 12 wherein the control device corrects the wavelengths of the amplified beams in response to changes in the wavelengths of the amplified beams.

16. The system according to claim 12 wherein the control device corrects the wavelengths of the amplified beams in response to changes in positions of components in the system.

17. A fiber amplifier system comprising:
a plurality of seed beam sources where one source is provided in each of a plurality of fiber amplification channels, each seed beam source generating a seed beam at a wavelength that is different than the wavelength of the seed beams generated by the other seed beam sources, wherein each seed beam source includes a beam wavelength tuning capability;
a fiber amplifier provided in each amplification channel that receives the seed beam in that channel and provides an amplified beam;
an emitter array responsive to all of the separate amplified beams and directing the amplified beams into free space as diverging uncombined beams;
beam collimating optics responsive to the diverging uncombined beams and redirecting the diverging uncombined beams as collimated uncombined beams;

a spectral beam combining (SBC) grating responsive to the collimated uncombined beams and spatially combining the collimated uncombined beams at the different wavelengths so that all of the separate amplified beams in the collimated uncombined beams are directed in the same direction as an output beam;

a beam sampler responsive to the output beam and providing a sample beam therefrom that includes a portion of all of the amplified beams;

a far-field optic responsive to the sample beam and generating a far-field image of the sample beam;

a detector assembly positioned in the far-field of the system and being responsive to the sample beam, said detector assembly including a first fiber sampler and a second fiber sampler spaced apart from each other and being positioned relative to a dispersive axis of the SBC grating, said first fiber sampler generating a first fiber sample beam having a first intensity and including a wavelength portion of all of the amplified beams, and said second fiber sampler generating a second fiber sample beam having a second intensity and including a wavelength portion of all of the amplified beams, wherein the first and second fiber samplers are positioned about one far-field beam diameter apart so that they are at a maximum slope of a Gaussian intensity distribution of the far-field image of the sample beam;

a 1×2 switch responsive to the first fiber sample beam and the second fiber beam and selectively outputting either the first fiber sample beam and the second fiber beam;

an optical spectrum analyzer (OSA) responsive to the first fiber beam and the second fiber beam from the switch, said OSA separating and detecting the power of the different wavelengths in both the first and second fiber sample beams and outputting an intensity signal identifying the detected power of the beams; and a single control device responsive to the electrical signals from the OSA, determining a difference in the intensity of the wavelength portion of the amplified beams having the same wavelength from the first and second fiber sample beams for each channel, and controlling the wavelength of the seed beam source for that channel using the electrical signal.

18. The system according to claim 17 wherein the feedback components control a current actuator in the beam sources to provide current control for changing the wavelengths of the seed breams or a temperature actuator in the beam sources to provide temperature control for changing the wavelengths of the seed beams.

19. The system according to claim 17 wherein the control device corrects the wavelengths of the amplified beams in response to changes in the wavelengths of the amplified beams.

20. The system according to claim 17 wherein the control device corrects the wavelengths of the amplified beams in response to changes in positions of components in the system.

* * * * *